(12) United States Patent
Roy et al.

(10) Patent No.: US 6,858,828 B2
(45) Date of Patent: Feb. 22, 2005

(54) PHOTOCELL INCORPORATING A LIGHTGUIDE AND MATRIX COMPOSED OF SUCH PHOTOCELLS

(75) Inventors: François Roy, Seyssins (FR); Thierry Devoivre, Gieres (FR); Yann Marcellier, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 317 days.

(21) Appl. No.: 10/246,804

(22) Filed: Sep. 18, 2002

(65) Prior Publication Data

US 2003/0081895 A1 May 1, 2003

(30) Foreign Application Priority Data

Sep. 18, 2001 (FR) .......................................... 01 12051

(51) Int. Cl.[7] .............................................. H01L 27/00
(52) U.S. Cl. .............................. 250/208.1; 250/227.11; 257/432; 438/65
(58) Field of Search .............................. 250/208.1, 216, 250/227.11, 214.1; 257/290, 291, 431, 432, 435; 438/65, 66, 69, 70

(56) References Cited

U.S. PATENT DOCUMENTS

| | | | | |
|---|---|---|---|---|
| 5,321,249 A | * | 6/1994 | Nomura | 250/208.1 |
| 5,952,645 A | * | 9/1999 | Wang et al. | 250/208.1 |
| 6,127,668 A | * | 10/2000 | Baek | 250/208.1 |

| | | | | |
|---|---|---|---|---|
| 2004/0159774 A1 | * | 8/2004 | Mishina et al. | 250/208.1 |

FOREIGN PATENT DOCUMENTS

| | | |
|---|---|---|
| JP | 61049466 | 3/1986 |
| JP | 06169075 | 6/1994 |
| JP | 10154805 | 6/1998 |
| JP | 2001237405 | 8/2001 |

OTHER PUBLICATIONS

Van Zant, P., "Microchip Fabrication—A Practical Guide to Semiconductor Processing", *Basic Patterning—Developing to Final Inspection*, Chapter 9, pp. 256–280, 2000.
French Preliminary Search Report dated Jul. 19, 2002 for French Application No. 0112051.

* cited by examiner

*Primary Examiner*—Kevin Pyo
(74) *Attorney, Agent, or Firm*—Lisa K. Jorgenson; Jon A. Gibbons; Fleit, Kain, Gibbons, Gutman, Bongini & Bianco P.L.

(57) ABSTRACT

A photocell having an entry face for the light and a photosensitive element, as well as to a matrix composed of such photocells. A lightguide-forming element placed between the entry face and the photosensitive element of the photocell ensures optical coupling between the latter two components. It makes it possible to place on either side of the photosensitive element electronic components for reading and for controlling the photocell, while reducing the loss of light incident on the entry face corresponding to the rays which would strike these electronic components. This lightguide-forming element is composed of at least three dielectric materials having different respective optical refractive indices and placed within concentric volumes.

40 Claims, 2 Drawing Sheets

PHOTOCELL INCORPORATING A LIGHTGUIDE AND MATRIX COMPOSED OF SUCH PHOTOCELLS

CROSS REFERENCE TO RELATED APPLICATIONS

This application is based upon and claims priority from prior French Patent Application No. 0112051, filed Sep. 18, 2001, the disclosure of which is hereby incorporated by reference in its entirety.

BACKGROUND OF THE INVENTION

1. Field of the Invention

The present invention generally relates to a photocell having a photosensitive element incorporated into a semiconductor substrate and an entry face through which the light enters and more particularly related to the means of optical coupling between the entry face and the photosensitive element.

2. Description of Related Art

Many optical components incorporate a photocell. Such components are, for example, optical detectors consisting of a single element, or photocell, sensitive to the light incident on its entry face. They may also be optical detectors formed from a matrix photocells juxtaposed alongside one another, the respective entry faces of which lie in one and the same plane. In this case, the photocells may be distinguished by their position within the matrix, for example for detecting the position of a light spot on the surface of this matrix. They may also be distinguished by the wavelength of the light to which each of them is sensitive, or distinguished by a combination of the sensitivity wavelength and of the position of the photocell within the matrix, for example for detecting polychromatic light images.

In such components, the photocell has small dimensions in order to achieve good spatial resolution. For example, it has a light entry face having the approximate dimensions of 5 $\mu$m×5 $\mu$m ($\mu$m meaning micrometer). Consequently, the amount of light entering the photocell is limited by the size of this entry face.

The photocell has in general an overall cylindrical shape, the cross section of which in a plane orthogonal to the main axis of this cylinder can vary in shape. When the photocell is shown in cross section in a plane containing its main axis, this axis is in general shown as lying along the vertical, with the entry face at the top and the sensitive surface at the bottom. Hereafter, the terms "lower" and "upper" used in relation to the designation of the constituent elements of the photocell, or of the photosensitive matrix, are so by reference to this convention. The photocell is thus bounded in its upper part by the entry face and in its lower part by a semiconductor substrate whose inner surface with respect to the photocell is substantially plane and parallel to the entry face. This semiconductor substrate carries, on part of its surface, the photosensitive element. At this element, in order to increase the sensitivity, the inner surface of the substrate may be made particularly rough, but it maintains a substantially plane overall geometry. An optical device may also be placed on or near the plane surface of the photosensitive element. This optical device may consist of anti-reflection layers or of a microlens matched to the surface of the photosensitive element.

The photosensitive element is in general a surface portion of the semiconductor substrate, the surface portion being especially treated in order to fulfill this function. However, this surface of the substrate includes, inside the photocell, apart from the above photosensitive element, a surface portion occupied by electronic components integrated into the photocell.

These components form part of the means for reading and controlling the photosensitive photocell. The photosensitive element therefore has a photosensitive surface whose area is less than the area of the entry face. For example, the dimensions of the photosensitive surface are 2 $\mu$m×2 $\mu$m for an entry face of 5 $\mu$m×5 $\mu$m.

In practice, as a result, in the case of incident light in the form of a beam directed approximately normal to the entry face, that portion of the light entering the photocell which illuminates the semiconductor substrate at the electronic components is lost, because it does not reach the photosensitive element. This loss reduces the sensitivity of the photocell, particularly for low incident light intensities, compared with theoretical sensitivity defined by the size of the entry face for light to enter the photocell.

To overcome this drawback, a convergent microlens is usually placed at the entry surface in order to focus, onto the photosensitive element, the light entering through the entire surface of the entry face. In this case, the reduction in sensitivity of the photocell is to a large part avoided.

However, this use of a microlens is no longer suitable when the distance between the entry face and the surface of the semiconductor substrate is too great. For the photocell dimensions mentioned above, this distance may be between 6 $\mu$m and 10 $\mu$m. This is especially the case when the electronic components placed on the semiconductor substrate in the immediate vicinity of the photosensitive element require several levels of metallization above the surface of this substrate, for example three or more metallization levels. In this configuration, the microlens must have a sufficiently large focal length, approximately equal to the distance which separates the microlens from the surface of the photosensitive element, to make the light converge on this surface.

For such small dimensions of the entry face, it is difficult to produce microlenses having sufficiently large radii of curvature. Microlenses having focal lengths which are too short cause the light entering the photocell via the entry face to converge above the surface of the photosensitive element, several micrometers therefrom. The light then diverges again between its point of convergence and the surface of the photosensitive element. The desired effect of using the microlens is therefore reduced, if not lost in its entirety. Accordingly, a need exists to overcome the problem with the light divergence in photocells and especially photocells with microlenses.

SUMMARY OF THE INVENTION

The present invention provides an optical coupling element between the entry face for the light entering the photocell and the photosensitive element which avoids the loss of sensitivity and does not have this limitation. It provides for a lightguide-forming element to be placed between the entry face and the photosensitive element, the function of which element is to make the light entering via the entry surface of the photocell converge on the sensitive element.

The present invention thus provides a photocell having an entry face for the light and a plane photosensitive element, the entry face and the surface of the photosensitive element having respective sections in mutual correspondence by means of a lightguide-forming element placed between them. This lightguide consists of a first homogeneous volume filled with a first dielectric material having a first optical refractive index and of a second volume filled with at least a second dielectric material having a second optical refractive index less than the first optical refractive index. The first volume has an upper surface and a lower surface which lie parallel to the cross section of the entry face and to the cross section of the photosensitive element respectively. This first volume is bounded by these upper and lower surfaces and furthermore by a continuous lateral surface connecting the perimeters of the upper surface to the lower surface and separating the first and second volumes, the second surrounding the first over at least part of the distance between the upper and lower surfaces of this first volume.

The expression "respective cross sections of the surface of the photosensitive element and of the entry face in mutual correspondence by means of a lightguide-forming element placed between them," is understood to mean, respectively, that portion of the surface of the photosensitive element which receives light upon uniform illumination of the entry face and that portion of the entry face via which this light reaching the photosensitive surface enters.

The lightguide-forming element according to the invention therefore participates in the transmission of the light between the entry face and the surface of the photosensitive element, by reducing the light intensity losses that may result especially from the geometry of the photocell or from the optical absorption of the materials through which this light passes.

The photosensitive element in question may be sensitive to visible, infrared or ultraviolet light. The optical refractive indices in question consequently relate to the wavelength of the light for which the photocell is designed.

The entry face of the photocell is usually substantially parallel to the surface of the semiconductor substrate of the sensitive element, but the present invention may be applied to other photocell geometries in which the entry face is not parallel to the surface of the sensitive element.

In a preferred embodiment, the cross section of the entry face has an area greater than that of the cross section of the photosensitive element with which it is in correspondence. To achieve effective optical coupling between these two cross sections, the lower surface of the first volume has a smaller area than that of the upper surface of this first volume. In particular, the area of the lower surface of the first volume is, for example, at most equal to 50% of the area of the upper surface of this same first volume. The lateral surface by which the first volume is bounded may then have the shape of a cone, the generatrices of which bear on the perimeter of the upper surface and the perimeter of the lower surface. The shape of the cross section of this cone therefore depends on those of the upper and lower surfaces. Advantageously, this shape will be matched to that of the entry face and to that of the photosensitive element.

Thus, the lightguide-forming element has the effect of concentrating the light entering via its upper surface onto the small area of the photosensitive element. This effect is obtained within the first volume by reflection of the light rays off the interface between the first and second dielectric materials. This reflection is made effective by the choice of the optical refractive indices of these two dielectric materials. In particular, for certain light rays, geometrical conditions for total reflection, for which all of the energy of the incident beam is transferred to the reflected beam, are obtained, contributing to the effectiveness of the lightguide.

For photocell geometries in which the entry face is not parallel to the surface of the sensitive element, the first volume of the lightguide-forming element may assume the shape of a curved cylinder, the extreme cross sections of which, forming the upper and lower faces of this volume, are parallel to the entry face and to the surface of the photosensitive element respectively, and/or the shape of a curved tube, the cross section of which progressively varies along this tube. Such configurations may be useful for preventing an undesirable portion of the incident radiation from reaching the surface of the sensitive element, the lightguide selectively directing, depending on the wavelength, a portion of the incident light onto the photosensitive element.

Furthermore, the photocell of the present invention comprises a third dielectric material inserted between the first and second volumes, over at least a portion of the lateral surface of the first volume. This third dielectric material is a compound based on silicon oxycarbonitride. The optical refractive index of this third dielectric material is chosen in such a way that it is less than the first optical refractive index. Thus, this third dielectric material helps to increase the effectiveness of the reflection of a light ray towards the interior of the first volume; likewise, it increases the range of angles with respect to the axis of the photocell of the incident rays which will be reflected within the first volume. This technique makes it possible to circumvent variations in index of a multilayer which possibly occupies the second volume.

Advantageously the optical refractive index of the third dielectric material may be chosen to favor total reflection of the light rays off the interface between the first and third dielectric materials at the lateral surface of the first volume.

In one particular configuration of the photocell, the photosensitive element is carried by a substantially plane substrate, which furthermore carries electronic components. These electronic components occupy a portion of that surface of the substrate which is adjacent to that surface portion of the substrate which is occupied by the photosensitive element. In particular, the electronic components fulfill, in a known manner, the functions of reading and of controlling the photocell. The lightguide according to the invention is advantageously placed so as to concentrate the light entering the photocell via its entry face onto that surface portion of the substrate which is occupied by the photosensitive element, preventing some of this light from reaching that surface portion of the substrate which is occupied by the electronic components.

The subject of the invention is also a photosensitive matrix composed of several photocells as defined above, wherein the respective entry faces of the photocells are in one and the same first plane common to all the photocells and wherein the surfaces of the respective photosensitive elements of the photocells are in one and the same second plane common to all the photocells.

Advantageously, the respective upper faces of the first volumes of lightguide-forming elements of the photocells then lie in one and the same third common plane. These upper faces are spaced apart in pairs in this third plane by a predetermined gap in such a way that the total area occupied by the gaps in this third common plane is, for example, at most equal to 5% of the total area of the cross section of the matrix in this third plane. The lightguide according to the invention incorporated into each photocell of the matrix therefore makes it possible to reduce the light lost in the separation gap between two adjacent photocells. It thus contributes to obtaining a particularly fine spatial resolution of the matrix.

Another advantage of the present invention relates to matrices illuminated by a divergent light beam. The light rays of such a beam can enter the photocells around the periphery of the matrix obliquely, whereas they enter the photocells at the center of this matrix almost normal to their entry faces. This results in a lower contrast of the peripheral photocells compared with the central photocells. The matrices according to the present invention have a reduced contrast difference between their center and their periphery.

The present invention also relates to an integrated chip comprising at least one photocell of a type described above and electronic components for processing signals produced by the at least one photocell. The signals processed by some of the electronic components may be analogical or numerical signals. Such a chip provides a very compact means for picking video or luminous information and delivering data issued from these video or luminous information with a readable format to a processor for further processing.

The present invention also relates to a method for fabricating a photocell or a photocell matrix as described above. Such a method will be described thereafter in conjunction with the description of a detailed embodiment of a photocell and of a photocell matrix according to the invention.

BRIEF DESCRIPTION OF THE DRAWINGS

The subject matter which is regarded as the invention is particularly pointed out and distinctly claimed in the claims at the conclusion of the specification. The foregoing and other features, and advantages of the invention will be apparent from the following detailed description taken in conjunction with the accompanying drawings.

DETAILED DESCRIPTION OF AN EMBODIMENT

Figure 1:
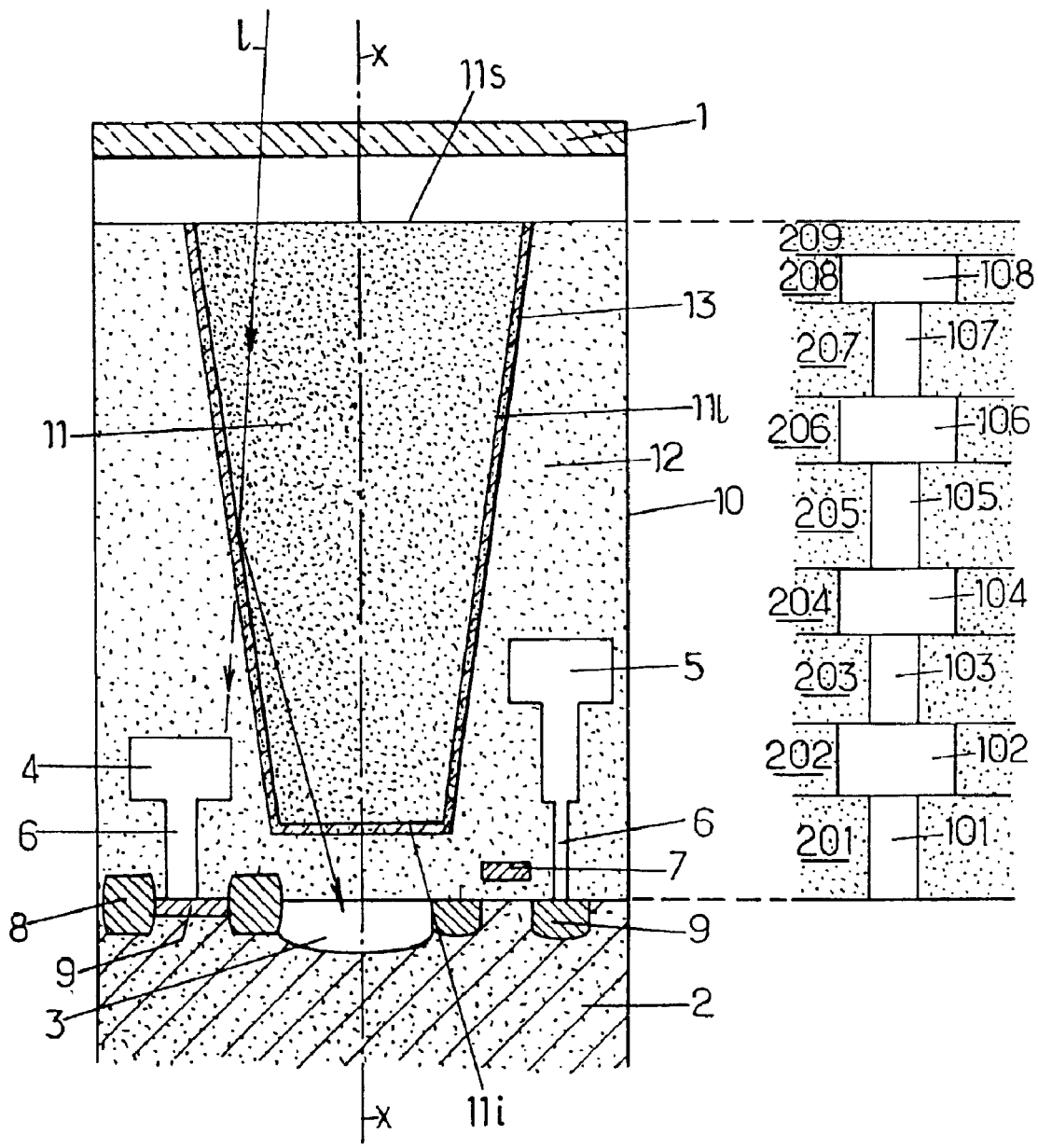
FIG. 1 is a sectional view of a photocell according to the invention in a plane containing the axis of the photocell, according to the present invention.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality. In the drawing like numerals refer to like parts through several views.

FIG. 1 is a sectional view in a plane containing the main axis X—X of the photocell shown in accordance with the convention mentioned in the introduction. It illustrates various components of a photocell incorporating a lightguide according to the invention. The photocell comprises, in its upper part, a transparent plate forming the entry face 1 for the light. This plate may be of transparent plastic or glass plate. In the example shown, the main axis X—X of the photocell is an axis passing through the center of this entry face 1 and perpendicular to it.

In the lower portion of the photocell, a semiconductor substrate 2, placed parallel to the entry face 1, carries on its surface a photodiode 3 centered with respect to the main axis X—X of the photocell. Various electronic components 9 are also produced on the surface of this substrate 2, or within materials placed above this substrate 2. The latter components are connected to the surface of the substrate by metal connections 6. These components comprise, for example, a read electrode 4, a resetting electrode 5, a resetting gate 7 and an electrically isolating gate oxide layer 8. The production and the operation of these components within a photocell are known to those skilled in the art.

In the example shown, a lightguide-forming element 10 is composed of three separate dielectric materials: a first dielectric material in a volume 11, a second dielectric material in a volume 12 and a third dielectric material 13 in the form of a layer of approximately uniform thickness placed at the interface between the volumes 11 and 12 along the continuous lateral surface 11l of the volume 11. The upper surface 11s and lower surface 11i of the volume 11 are horizontal and parallel to the plate of the entry face 1 and to the surface of the photodiode 3. The shape of the volume 11 is a truncated cone, the cross section of which may be of any shape, for example square, and the sides of which are parallel to the edges of the entry face 1. The lower end of this cone, corresponding to its lower surface 11i, has for example a cross section of the same area as the active surface of the photodiode 3, for example 2 $\mu$m×2 $\mu$m. Its upper end, corresponding to its upper surface 11s, has as large an aperture as possible with respect to the dimensions of the entry face 1, for example 4 $\mu$m×4 $\mu$m. The distance between the upper surface 11s and the lower surface 11i of the volume 11 is for example 8 $\mu$m.

The second dielectric material is preferably silica, chosen for its low optical refractive index for visible light, this being about 1.46. The first dielectric material is advantageously a compound of silicon, oxygen, carbon and nitrogen, called silicon oxycarbonitride, or it may possibly be silicon nitride. Its optical refractive index, depending on the stoichiometry of the elements of which it is composed, may vary between 1.6 and 2.3. Alternatively, tantalum oxide may also be used as the first dielectric material. The third dielectric material, placed at the interface between the first two, is preferably again of the silicon oxycarbonitride type, but with a composition giving it an optical refractive index less than that of silica and that of the first dielectric material. In particular, it may have a fluorine content which gives it a particularly low optical refractive index value.

In some cases, the third dielectric material may have an optical refractive index less than that of the first dielectric material, but higher than that of the second dielectric material. The third dielectric material may be then silicon nitride.

Because of the process used for producing the photocell, the third dielectric layer 13 is also present at the lower surface 11i of the volume 11. Unlike the increase in reflection provided by this layer at the lateral surface 11l, the almost normal incidence of the light rays on the lower surface 11i makes the reflection of the rays off this lower surface very small, and even negligible, even in the presence of the third dielectric layer 13.

The thickness of this third dielectric material may be chosen in a known manner by a person skilled in the art so as to increase the reflection of light rays off the lateral surface 11l. Thus, as shown in FIG. 1, an incident ray 1 entering the photocell via the entry face 1 may be initially directed towards that surface portion of the substrate 2 which is occupied by the electronic components. It is then reflected by the lateral surface 11l of the lightguide and redirected towards the photodiode 3, thus contributing to the signal detected by the latter.

The above photocell may be fabricated in various ways, depending on the techniques used for depositing the materials in layers. The semiconductor substrate is usually made of silicon and the components integrated into its surface are produced using the known methods of fabricating integrated components. These components comprise at least the photosensitive element and electronic components. The electronic components may include components for controlling the photosensitive element such as those labeled 8 and 9 on FIG. 1.

Several dielectric layers, for example six layers or more, corresponding to the second dielectric material, are then deposited during successive steps on the substrate, these being separated by metallization steps for producing the elements 4, 5 and 6, as well as metallic interconnections. The right-hand part of FIG. 1 shows an element for controlling the photocell, corresponding to eight metallization levels 101 to 108. Such a control element is usually associated with each photocell, being placed on the substrate 2 of the photocell at a certain distance from the latter. Corresponding to each of the eight metallization levels is a silica layer 201 to 208, plus an upper silica layer 209, so as to completely constitute the second dielectric material occupying the volume 12. The layers 201 to 209 are then also present in the photocell, filling the volume 12.

A mask is then placed on the upper surface of this silica layer so as to leave exposed only a portion of this surface corresponding to the upper surface 11s. Next, the assembly is subjected to a process to remove the silica at the point where it is exposed. This removal may be carried out by dissolving the silica in a bath containing hydrofluoric acid, with a concentration and under operating conditions which provide a progressive silica dissolution front having as final shape that of the surface 11l completed by the lower surface 11i. An alternative process to remove the silica material is plasma-assisted etching, especially assisted by a "polymerizing plasma" so as to obtain an etched volume whose cross section decreases with depth. Finally, the mask is removed from the unetched portion of the upper surface of the silica by one or more standard processes. Such processes, respectively named chemical and dry etching, and their implementation are known to those skilled in the art and reference may be made, for example, to the work by Peter Van Zant: "Microchip Fabrication," McGraw-Hill, fourth edition.

The third and then the first dielectric materials are then successively deposited, especially by using one of the CVD processes, for example the plasma enhanced chemical vapor deposition process. The gaseous chemical compounds used in such process are chosen to provide, simultaneously, the elements oxygen, carbon, nitrogen, silicon and, possibly, fluorine. They are introduced with relative proportions resulting in the composition of the deposited material which corresponds to the desired value of the optical refractive index for each of the third and first dielectric materials.

The excess dielectric material deposited is removed, for example by abrasion, and the photocell is then completed in the usual manner.

Figure 2:
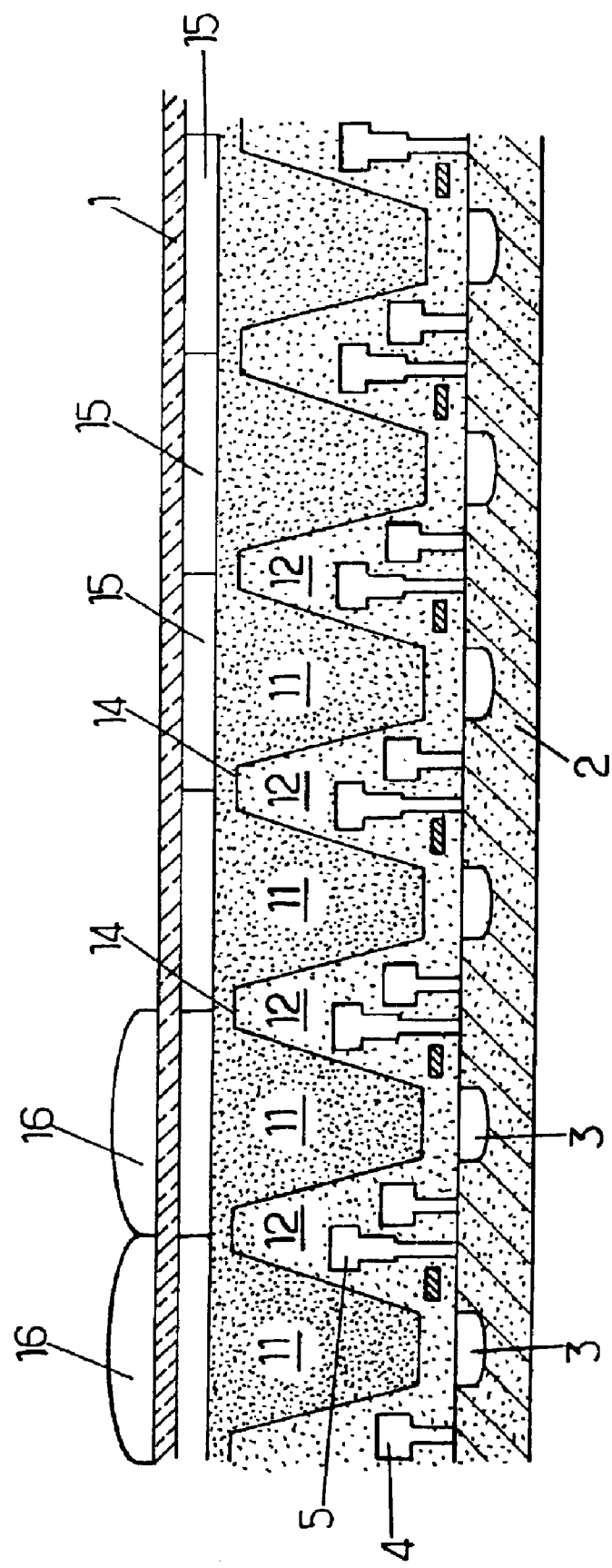
FIG. 2 is a sectional view of a matrix formed from photocells similar to that illustrated in FIG. 1, according to the present invention.

A large number of photocells similar to the above one may be simultaneously produced on the surface of a large substrate. In this way, a two-dimensional matrix of photocells is obtained, each of them representing an elementary dot, or "pixel", of this matrix. FIG. 2 is a sectional view of such a matrix. All the photocells share, in addition to the same semiconductor substrate 2, the same transparent entry face plate 1. Each photocell contains the same electronic components as those described above with regard to FIG. 1. It also contains a lightguide-forming element composed of two or three dielectric materials different from the type described above with regard to FIG. 1. In particular, the first and second dielectric materials fill the respective volumes 11 and 12 of each photocell. When necessary, the third dielectric material is located at the interface between the volumes 11 and 12.

As shown in FIG. 2, the entry face 1 is continuous between two adjacent photocells and transmits the light to all the photocells located beneath this entry face. The photocells are distinguished individually from each other by their lightguide and their respective electronic components. The shape of each pixel is then determined by the upper surface 11s of the first volumes 11 of the lightguide of each photo photocell. This shape can vary depending on the desired appearance for the entry face 1 of the matrix and allows this entry surface to be paved by the juxtaposed photocells. It may be square, hexagonal or more complex in shape.

Joining the second volumes 12 of all the photocells of the matrix forms a continuous overall volume having respective recesses at each photocell and edges between two adjacent photocells, the recesses being occupied by the respective first volumes 11 of the photocells. During fabrication of the matrix, the steps of depositing the second dielectric material, which are similar to those described above for fabricating a single photocell, allow all the photocells to be produced simultaneously, by depositing continuous silica layers over the entire surface of the matrix.

A narrow gap 14 then appears between two neighboring photocells, the gap being due to the process of removing the silica used for forming the lightguides. The incident light which traverses the entry face of the matrix and strikes the surface of the second dielectric material at the aforementioned edges (edges of the overall volume formed by joining the second volumes belonging to adjacent photocells) is caught neither by one of the lightguides of these photocells nor by the other. Light is therefore lost with respect to the signal detected by the matrix. It is therefore important that the width of these gaps 14 be as small as possible. For photocells having a width of 5 $\mu$m for example, these gaps may have a width of 0.5 $\mu$m. In one embodiment of the matrix structure according to the invention, the area of the matrix surface occupied by all of these gaps 14 represents about 1% of the area of the total cross section of the matrix in a plane containing these gaps.

Such a photosensitive matrix may furthermore include, at the entry face 1, a color filter 15 associated with each photocell. The tuning wavelength of the filter, defining its color for an operational filter in visible incident light, may vary between two adjacent photocells so as to locally distinguish different chromatic components of the incident light.

This matrix may also include, at the entry face 1, a convergent microlens 16 associated with each photocell. FIG. 2 shows two such microlenses 16 located above the two photocells of the matrix furthest to the left. Such a microlens 16 then contributes, with the lightguide according to the invention incorporated into the photocell, in concentrating the incident light entering via the entry face 1 onto the photodiode 3. Particularly advantageously, these microlenses 16 reduce the amount of light lost due to the gaps 14. The fabrication and the positioning of these microlenses at the entry face are carried out in a manner known per se.

Although a specific embodiment of the invention has been disclosed, it will be understood by those having skill in the art that changes can be made to this specific embodiment without departing from the spirit and scope of the invention.

The scope of the invention is not to be restricted, therefore, to the specific embodiment, and it is intended that the appended claims cover any and all such applications, modifications, and embodiments within the scope of the present invention.

What is claimed is:

1. A photocell comprising:
   an entry face for light;
   a photosensitive element; and
   a lightguide placed between the entry face and the photosensitive element, wherein the lightguide includes:
      a first volume filled with a first dielectric material with a first optical refractive index; and
      a second volume filled with at least a second dielectric material with a second optical refractive index less than the first optical refractive index;
   wherein, the first volume being bounded by an upper surface and a lower surface which lie parallel to a section of the entry face and to a section of the photosensitive element respectively, and the first volume being bound by a continuous lateral surface connecting a perimeter of the upper surface to a perimeter of the lower surface, and separating the first volume and the second volume, the second volume surrounding the first volume over at least part of a distance between the upper surface and the lower surface of the first volume;
      a third dielectric material with a third optical refractive index, inserted between the first volume and the second volume, and over at least part of the continuous lateral surface of the first volume, the third optical refractive index being less than the first optical refractive index;
   wherein the third dielectric material is a compound based on silicon oxycarbonitride.

2. The photocell according to claim 1, wherein the lower surface of the first volume has a smaller area than an area of the upper surface of the first volume.

3. The photocell according to claim 2, wherein the area of the lower surface of the first volume is at most equal to 50% of the area of the upper surface of the first volume.

4. The photocell according to claim 2, wherein the continuous lateral surface by which the first volume is bound is a conical shape.

5. The photocell according to claim 1, wherein the second dielectric material is silica.

6. The photocell according to claim 1, wherein the first dielectric material is one of a compound of the silicon oxycarbonitride or silicon nitride.

7. The photocell according to claim 1, wherein the first dielectric material is composed of one or more of the following: silicon, oxygen, carbon, nitrogen, silicon oxycarbonitride, silicon nitride, and tantalum oxide.

8. The photocell according to claim 1, wherein the photosensitive element is carried by a substantial plane substrate, the substrate furthermore includes electronic components which occupy a portion of a surface of the substrate which is adjacent to a surface portion of the substrate which carries the photosensitive element.

9. A photocell matrix comprising:
   a plurality of photocells, at least one of the photocells including:
      an entry face for light;
      a photosensitive element; and
      a lightguide placed between the entry face and the photosensitive element, wherein the lightguide includes:
         a first volume filled with a first dielectric material with a first optical refractive index; and
         a second volume filled with at least a second dielectric material with a second optical refractive index less than the first optical refractive index;
      wherein, the first volume being bound by an upper surface and a lower surface which lie parallel to a cross section of the entry face and to a cross section of the photosensitive element respectively, and the first volume being bounded by a continuous lateral surface connecting a perimeter of the upper surface to a perimeter of the lower surface and separating the first volume and the second volume, the second volume surrounding the first volume over at least part of a distance between the upper surface and the lower surface of the first volume;
         a third dielectric material with a third optical refractive index, inserted between the first volume and the second volume, and over at least part of the continuous lateral surface of the first volume, the third optical refractive index being less than the first optical refractive index;
      wherein the third dielectric material is a compound based on silicon oxycarbonitride.

10. The photocell matrix according to claim 9, wherein two or more of the at least one of the photocells are formed with the entry face in a first plane common and wherein a surface of each of the two or more photocells are formed in a second plane.

11. The photocell matrix according to claim 10, wherein the upper face of the first volume of the lightguide of the two or more of the at least one photocells are formed to lie in a third common plane so that any adjacent photocells are separated by a gap, and a total area occupied by a numeric sum of any gap in the third common plane being less than 5% of a total area of the third common plane.

12. The photocell matrix according to claim 9, wherein at least one of the plurality of photocells have a color filter at the entry face.

13. The photocell matrix according to claim 9, at least one of the plurality of photocells have convergent microlens at the entry face.

14. The photocell matrix according to claim 9, wherein the lower surface of the first volume has a smaller area than an area of the upper surface of the first volume.

15. The photocell matrix according to claim 14, wherein the area of the lower surface of the first volume is at most equal to 50% of the area of the upper surface of the first volume.

16. The photocell according to claim 14, wherein the continuous lateral surface by which the first volume is bound is a conical shape.

17. The photocell according to claim 9, wherein the second dielectric material is silica.

18. The photocell according to claim 9, wherein the first dielectric material is composed of one or more of the following: silicon, oxygen, carbon, nitrogen, silicon oxycarbonitride, silicon nitride, and tantalum oxide.

19. An integrated chip comprising at least one photocell and electronic components for processing signals produced by the at least one photocell, the photocell comprising:
   an entry face for light;
   a photosensitive element; and
   a lightguide placed between the entry face and the photosensitive element; wherein the lightguide includes:
      a first volume filled with a first dielectric material with a first optical refractive index; and a second volume filled with at least a second dielectric material with a second optical refractive index less than the first optical refractive index;

wherein, the first volume being bounded by an upper surface and a lower surface which lie parallel to a section of the entry face and to a section of the photosensitive element respectively, and the first volume being bound by a continuous lateral surface connecting a perimeter of the upper surface to a perimeter of the lower surface, and separating the first volume and the second volume, the second volume surrounding the first volume over at least part of a distance between the upper surface and the lower surface of the first volume;

a third dielectric material with a third optical refractive index, inserted between the first volume and the second volume, and over at least part of the continuous lateral surface of the first volume, the third optical refractive index being less than the first optical refractive index;

wherein the third dielectric material is a compound based on silicon oxycarbonitride.

20. The integrated chip according to claim 19, wherein the signals processed by at least part of the electronic components are analog signals.

21. The integrated chip according to claim 19, wherein the signals processed by at least part of the electronic components are digital signals.

22. A method for fabricating a photocell element comprising:

fabricating components at the surface of a substrate, the components including at least one photosensitive element and one or more electronic components;

depositing onto the surface of the substrate and onto the components at least one layer of dielectric material;

arranging at least one electrical conductive part in the layer of dielectric material out of a portion of the layer of dielectric material located above the photosensitive element;

forming a cavity into the layer of dielectric material above the photosensitive element, the cavity having walls joining the surface of the layer of dielectric material opposite the substrate; and depositing a film of a dielectric compound onto at least part of the walls of the cavity;

depositing a filling dielectric material into the cavity;

wherein the dielectric material of the layer and the dielectric compound of the film have respective optical refractive indices lower than an optical refractive index of the filling dielectric material; and, wherein the dielectric compound of the film is based on silicon oxycarbonitride.

23. The method according to claim 22, wherein the fabricating components includes components for controlling the photosensitive element.

24. The method according to claim 22, wherein the arranging at least one electrical conductive part in the layer of dielectric material includes components for controlling the photosensitive element.

25. The method according to claim 22, wherein the arranging at least one electrical conductive part in the layer of dielectric material includes at least one metallic interconnection.

26. The method according to claim 22, further comprising:

depositing above the surface of the substrate and above the components at least six layers of respective dielectric materials.

27. The method according to claim 22, wherein the forming a cavity into the layer of dielectric material includes using a mask defining a cross section of the cavity.

28. The method according to claim 22, wherein the forming a cavity into the layer of dielectric material includes using a removal process chosen among chemical etching and dry etching.

29. The method according to claim 22, wherein the forming a cavity into the layer of dielectric material is achieved so that a cross section of the cavity parallel to the surface of the substrate decreases with depth towards the photosensitive element.

30. The method according to claim 29, wherein the forming a cavity includes forming a cavity with a shape of truncated cone.

31. The method according to claim 22, wherein the depositing the at least one layer of dielectric material includes a layer of silica.

32. The method according to claim 22, wherein the depositing a film of dielectric compound includes a dielectric compound with an optical refractive index that is higher than an optical refractive index of at least one layer of the dielectric material.

33. The method according to claim 26, wherein the depositing a film of dielectric compound includes a dielectric compound with an optical refractive index that is higher than an optical refractive index of at least one layer of the dielectric material.

34. The method according to claim 22, wherein the dielectric compound of the film is of silicon nitride type.

35. The method according to claim 22, wherein the step of depositing the film of dielectric compound includes using a plasma enhanced chemical vapor deposition process.

36. The method according to claim 22, wherein the filling dielectric material is one of a compound of the silicon oxycarbonitride or silicon nitride.

37. The method according to claim 22, wherein the filling dielectric material is composed of one or more of the following: silicon, oxygen, carbon, nitrogen, silicon oxycarbonitride, silicon nitride, and tantalum oxide.

38. The method according to claim 22, wherein the depositing the filling dielectric material includes using a chemical vapor deposition process.

39. The method according to claim 22, wherein the depositing the filling dielectric material includes using a plasma enhanced chemical vapor deposition process.

40. The method according to claim 22, wherein a plurality of photocells are simultaneously fabricated, each photocell being located proximate to at least one other photocell, in such a way to form a photocell matrix.

* * * * *